(12) United States Patent
Kwon (10) Patent No.: US 8,477,543 B2
(45) Date of Patent: Jul. 2, 2013

(54) DATA INPUT CIRCUIT WITH A VALID STROBE SIGNAL GENERATION CIRCUIT

(75) Inventor: Kyoung-Hwan Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 175 days.

(21) Appl. No.: 13/051,060

(22) Filed: Mar. 18, 2011

(65) Prior Publication Data

US 2012/0026806 A1 Feb. 2, 2012

(30) Foreign Application Priority Data

Jul. 30, 2010 (KR) .................. 10-2010-0074329

(51) Int. Cl.
*G11C 7/22* (2006.01)

(52) U.S. Cl.
USPC ........... 365/189.16; 365/189.05; 365/233.13; 365/233.16; 365/206; 365/193; 365/198

(58) Field of Classification Search
USPC ........... 365/193, 194, 198, 191, 206, 189.16, 365/189.05, 233.13, 233.16
See application file for complete search history.

(56) References Cited

U.S. PATENT DOCUMENTS

| | | | | |
|---|---|---|---|---|
| 6,707,723 | B2 * | 3/2004 | Jeong | 365/189.05 |
| 7,031,205 | B2 * | 4/2006 | Han et al. | 365/193 |
| 7,543,172 | B2 * | 6/2009 | Kizer et al. | 713/401 |
| 2005/0005056 | A1 * | 1/2005 | Ware | 711/1 |
| 2006/0209619 | A1 | 9/2006 | Park | |

FOREIGN PATENT DOCUMENTS

| | | |
|---|---|---|
| JP | 2003059267 A | 2/2003 |
| KR | 1020040093858 A | 11/2004 |
| KR | 1020060101334 A | 9/2006 |

\* cited by examiner

*Primary Examiner* — Andrew Q Tran
(74) *Attorney, Agent, or Firm* — William Park & Associates Patent Ltd.

(57) ABSTRACT

A data input circuit includes a valid strobe signal generation circuit and a data strobe signal counter. The valid strobe signal generation circuit is configured to remove a pulse of an internal strobe signal generated and generate a valid strobe signal. The pulse may have been generated during a preamble period. The data strobe signal counter is configured to count the valid strobe signal according to burst length information and generate a write latch signal for aligning data at a time of a write operation.

22 Claims, 8 Drawing Sheets

DATA INPUT CIRCUIT WITH A VALID STROBE SIGNAL GENERATION CIRCUIT

CROSS-REFERENCES TO RELATED APPLICATIONS

The present application claims priority under 35 U.S. 119(a) to Korean application number 10-2010-0074329, filed on Jul. 30, 2010, in the Korean intellectual property Office, which is incorporated herein by reference in its entirety.

BACKGROUND

A semiconductor memory device has been continuously developed in order to increase the integration degree and the operation speed thereof. In order to increase the operation speed, a synchronous memory device has been introduced which can operate in synchronization with a clock supplied from the outside of a memory chip.

An early synchronous memory device is a single data rate (SDR) synchronous memory device which inputs/outputs data in synchronization with the rising edge of an external clock.

However, the SDR synchronous memory device could not sufficiently meet high-speed requirements of systems. In this regard, a double data rate (DDR) synchronous memory device has been introduced which processes two data in one clock cycle.

The DDR synchronous memory device successively inputs/outputs data in synchronization with the rising and falling edges of each clock cycle. Accordingly, without increasing the frequency of a clock, the DDR synchronous memory device can implement at least two times the bandwidth of the conventional SDR synchronous memory device. Hence, the DDR synchronous memory device can better accommodate high-speed operations.

The DDR synchronous memory device uses a multi-bit prefetch architecture for simultaneously processing multi-bit data. According to the multi-bit prefetch architecture, sequentially inputted data are aligned in parallel in synchronization with a data strobe signal, and the aligned multi-bit data are simultaneously stored in a memory cell array by a write command inputted in synchronization with an external clock signal.

In the multi-bit prefetch architecture, data needs to be aligned in synchronization with internal strobe signals DQS_R and DQS_F, and latched in synchronization with the final falling edge of a data strobe signal DQS.

Figure 1:
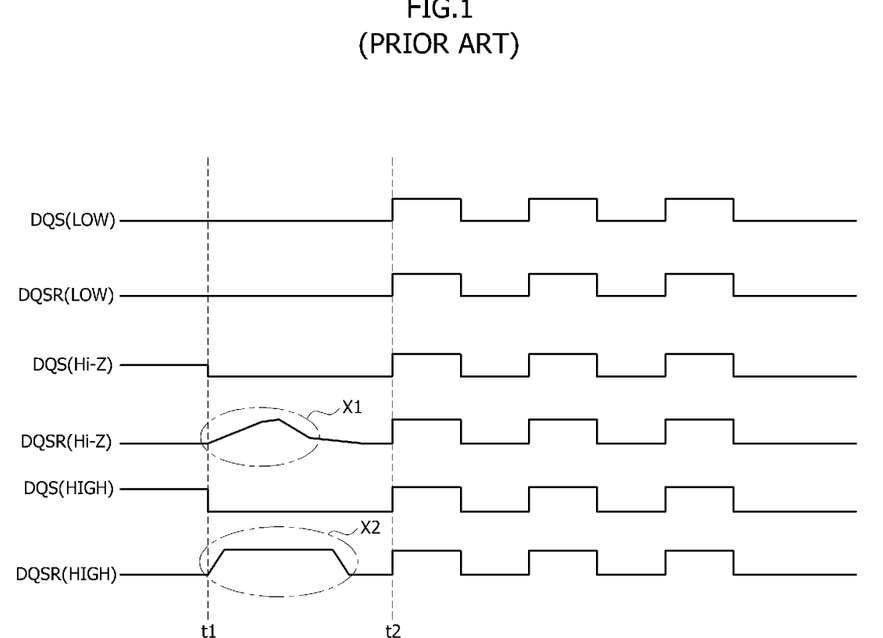
FIG. 1 is a timing chart illustrating waveforms of a data strobe signal and an internal strobe signal according to a conventional art.

As illustrated in FIG. 1, in the DDR synchronous memory device such as a DDR2 and a DDR3, the data strobe signal DQS is set to one of a logic low level LOW, a high-Z level Hi-Z and a logic high level HIGH before start of a preamble at time t1. When the data strobe signal DQS is set to the logic low level LOW before start of the preamble at time t1, a pulse of the internal strobe signal DQS_R is generated in synchronization with the rising edge of the data strobe signal DQS from the time t2 in point at which the preamble duration is completed.

When the data strobe signal DQS is set to the high-Z level Hi-Z Z or the logic high level HIGH before start of the preamble at time t1, a pulse may be generated in the internal strobe signal DQS_R during the preamble duration t1 to t2 as indicated by X1 and X2. This is because a circuit receiving the data strobe signal DQS to generate the internal strobe signal DQS_R is configured with a differential amplification circuit and differentially amplifies the data strobe signal DQS at the high-Z level Hi-Z or the logic high level HIGH.

If the internal strobe signal DQS_R is toggled in the preamble duration t1 to t2, an abnormal operation may occur when latching data in synchronization with the final falling edge of the data strobe signal DQS.

SUMMARY

An embodiment of the present invention relates to a data input circuit capable of substantially preventing an error in a write operation by accurately detecting the final falling edge of a data strobe signal even if an internal strobe signal is toggled in a preamble duration.

Please note that a "latch" may refer generally to either an edge-triggered device or a level-triggered device.

In one embodiment, a data input circuit may include a valid strobe signal generation circuit configured to remove a pulse, if present, of an internal strobe signal and generate a valid strobe signal. The pulse may have been generated during a preamble period. Also included may be a data strobe signal counter configured to count the valid strobe signal according to burst length information and generate a write latch signal for aligning data at a time of a write operation.

In another embodiment, a data input circuit may include a data strobe signal buffer configured to buffer a data strobe signal and generate a first internal strobe signal and a second internal strobe signal. Also included may be a valid strobe signal generation circuit configured to remove a pulse in the first internal strobe signal and generate a valid strobe signal, where the pulse may be generated during a preamble period.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 2:
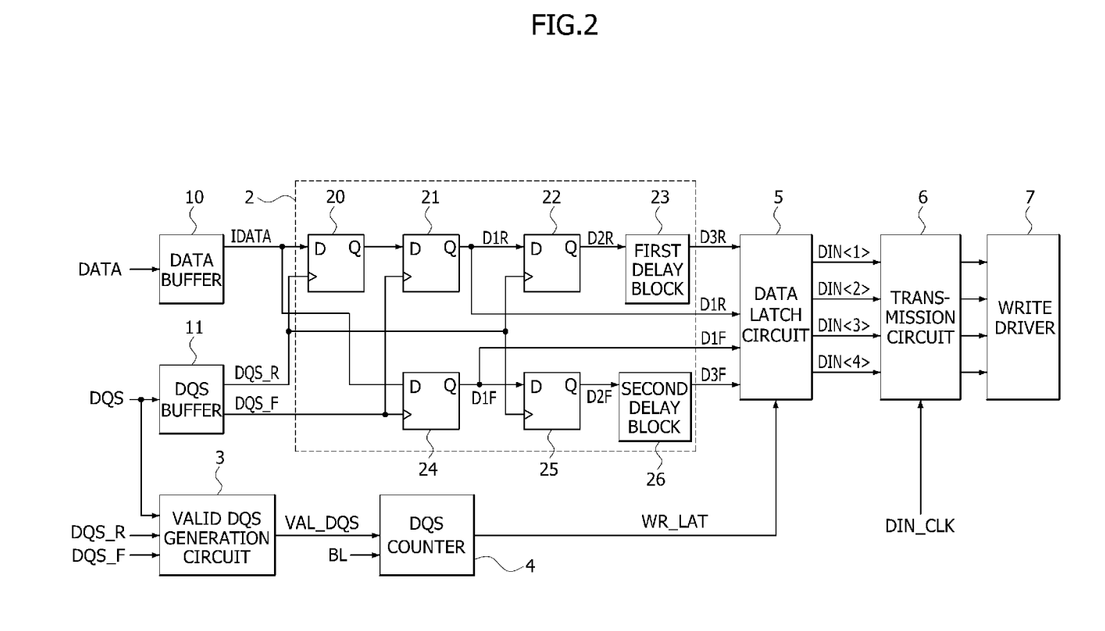
FIG. 2 is a block diagram illustrating the configuration of a data input circuit according to one embodiment of the present invention.

FIG. 2 is a block diagram illustrating the configuration of a data input circuit according to one embodiment of the present invention.

Referring to FIG. 2, the data input circuit according to one embodiment includes a data buffer 10, a data strobe signal buffer 11, a data alignment circuit 2, a valid strobe signal generation circuit 3, a data strobe signal counter 4, a data latch circuit 5, a transmission circuit 6, and a write driver 7.

The data buffer 10 is configured to buffer data DATA and generate internal data IDATA.

The data strobe signal buffer 11 is configured to receive a data strobe signal DQS and generate a first internal strobe signal DQS_R and a second internal strobe signal DQS_F. The first internal strobe signal DQS_R is generated in synchronization with a rising edge of the data strobe signal DQS and the second internal strobe signal DQS_F is generated in synchronization with a falling edge of the data strobe signal DQS.

The data alignment circuit 2 includes a first latch 20, a second latch 21, a third latch 22, a first delay block 23, a fourth latch 24, a fifth latch 25, and a second delay block 26. The first latch 20 is configured to latch and output the internal data IDATA in synchronization with the first internal strobe signal DQS_R. The second latch 21 is configured to latch an output signal of the first latch 20 in synchronization with the second internal strobe signal DQS_F and output first rising data D1R. The third latch 22 is configured to latch the first rising data D1R in synchronization with the first internal strobe signal DQS_R and output second rising data D2R. The first delay block 23 is configured to delay the second rising data D2R by a predetermined duration and output third rising data D3R. The fourth latch 24 is configured to latch the internal data IDATA in synchronization with the second internal strobe signal DQS_F and output first falling data D1F. The fifth latch 25 is configured to latch the first falling data D1F in synchronization with the first internal strobe signal DQS_R and output second falling data D2F. The second delay block 26 is configured to delay the second falling data D2F by a predetermined duration and output third falling data D3F. The first to third latches 20 to 22 and the fourth and fifth latches 24 and 25 may be configured with, for example, a D flip-flop.

The first rising data D1R, the third rising data D3R, the first falling data D1F, and the third falling data D3F, are aligned by the data alignment circuit 2 and may be latched together at substantially the same time by the data latching circuit 5 using same latching signal.

The valid strobe signal generation circuit 3 is configured to remove an unwanted pulse in the first internal strobe signal DQS_R. The unwanted pulse may be generated in a preamble duration. The valid strobe signal generation circuit 3 may also generate a valid strobe signal VAL_DQS in synchronization with the first internal strobe signal DQS_R and the second internal strobe signal DQS_F. A pulse of the valid strobe signal VAL_DQS is generated after the preamble duration is completed. Detailed configuration and operation of the valid strobe signal generation circuit 3 will be described later with reference to FIGS. 3 to 11.

The data strobe signal counter 4 is configured to use the valid strobe signal VAL_DQS and burst length information BL to generate a write latch signal WR_LAT. In more detail, when the burst length is set to 4, the data strobe signal counter 4 may generate a pulse for the write latch signal WR_LAT at the fourth falling edge of the valid strobe signal VAL_DQS. When the burst length is set to 8, the data strobe signal counter 8 may generate a pulse of the write latch signal WR_LAT at the sixth falling edge of the valid strobe signal VAL_DQS. Accordingly, the burst length counter 4 may count, for example, the number of pulses in a valid strobe signal VAL_DQS according to the burst length information BL. The burst length information BL includes information on whether the burst length has been set to, for example, 4, 8, 16, or 32, and may include a plurality of signals. According to other embodiments (not shown), the time at which the pulse of the valid strobe signal VAL_DQS is generated by the valid strobe signal generator circuit 3 may be variously set according to the burst length.

The data latch circuit 5 is configured to latch the third rising data D3R, the first rising data D1R, the first falling data D1F and the third falling data D3F in synchronization with the rising edge of the write latch signal WR_LAT and output first to fourth input data DIN<1:4>.

The transmission circuit 6 is configured to transmit the first to fourth input data DIN<1:4> to the write driver 7 in synchronization with a data input clock DIN_CLK.

Next, the detailed configuration and operation of the valid strobe signal generation circuit 3 will be described in detail with reference to FIGS. 3 to 11.

Figure 3:
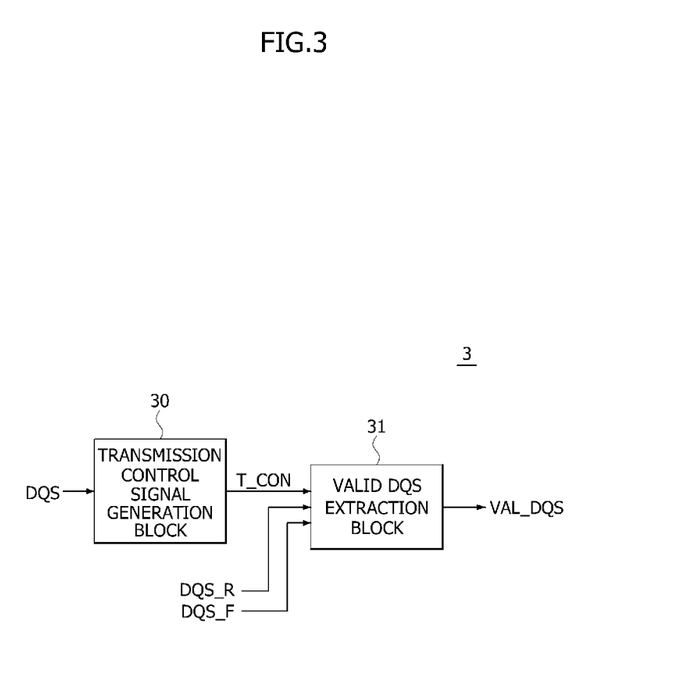
FIG. 3 is a block diagram illustrating the configuration of a valid strobe signal generation circuit included in the data input circuit illustrated in FIG. 2.

Referring to FIG. 3, the valid strobe signal generation circuit 3 includes a transmission control signal generation block 30 and a valid strobe signal extraction block 31. The transmission control signal generation block 30 is configured to generate a transmission control signal T_CON in response to a set level of the data strobe signal DQS, wherein the enable time point of the transmission control signal T_CON may be adjusted. The valid strobe signal extraction block 31 is configured to receive the first internal strobe signal DQS_R and the second internal strobe signal DQS_F in response to the transmission control signal T_CON and generate the valid strobe signal VAL_DQS.

Figure 4:
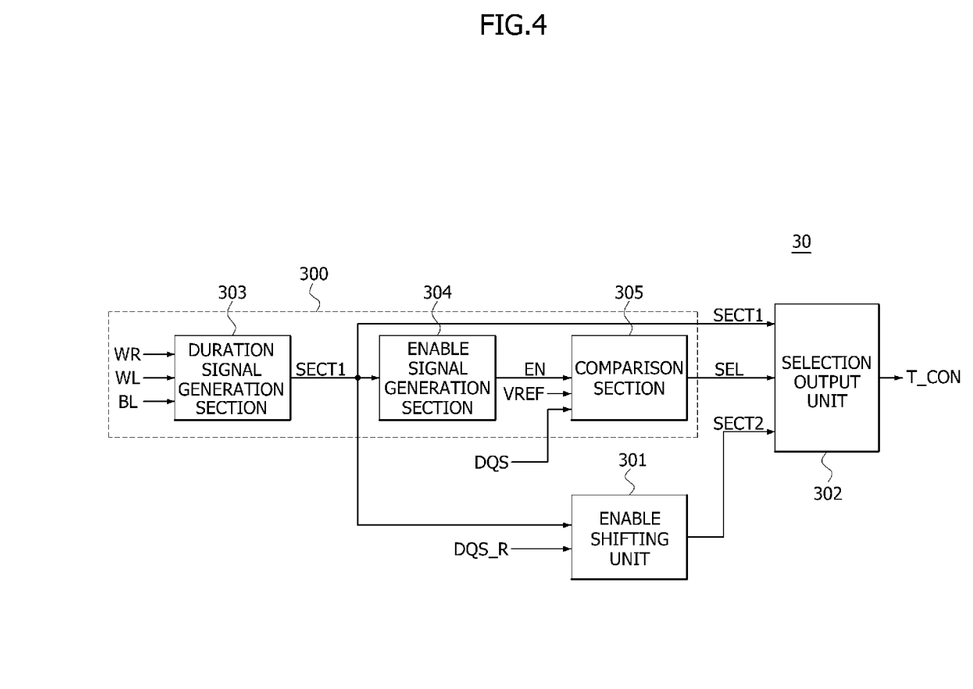
FIG. 4 is a block diagram illustrating the configuration of a transmission control signal generation block included in the valid strobe signal generation circuit illustrated in FIG. 3.

Referring to FIG. 4, the transmission control signal generation block 30 includes a signal generation unit 300, an enable shifting unit 301, and a selection output unit 302. The signal generation unit 300 includes a duration signal generation section 303, an enable signal generation section 304, and a comparison section 305. The duration signal generation section 303 is configured to receive a write command WR, write latency information WL and the burst length information BL to generate a first duration signal SECT1.

The first duration signal SECT1 is enabled to a logic high level at a time when the write command WR is asserted, and disabled to a logic low level after a duration determined using the write latency information WL and the burst length information BL. The enable signal generation section 304 is configured with a pulse generation circuit (not shown). The enable signal generation section 304 is synchronized with the first duration signal SECT1 to assert an enable signal EN, which is then deasserted after the preamble duration is started.

The comparison section 305 is enabled when the enable signal EN is asserted. A selection signal SEL may be asserted when the voltage level of the data strobe signal DQS is less than the voltage level of a reference voltage VREF. The reference voltage VREF may be set to a voltage level lower than a voltage level of the high-Z level Hi-Z. The high-Z level Hi-Z may be at an intermediate level between the logic high level and the logic low level of the data strobe signal DQS. The selection signal SEL is generated at the logic high level when the data strobe signal DQS has the logic low level, and is generated at the logic low level when the data strobe signal DQS is at the logic high level or the high-Z level Hi-Z.

Figure 5:
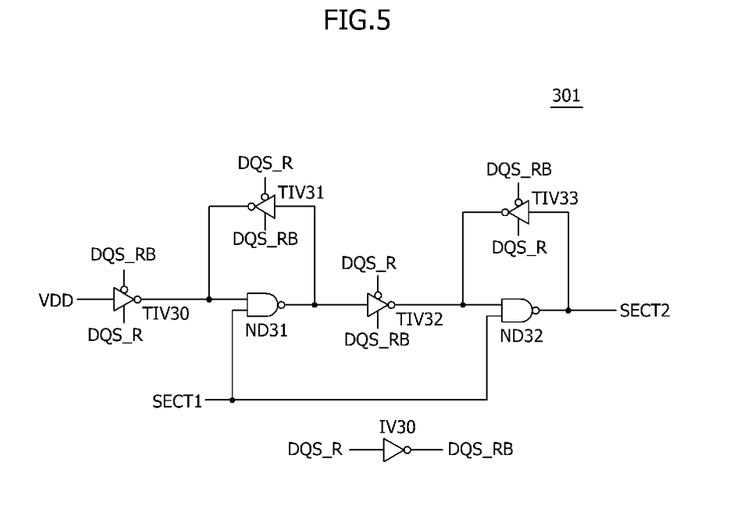
FIG. 5 is a circuit diagram of an enable shifting unit included in the transmission control signal generation block illustrated in FIG. 4.

Referring to FIG. 5, the enable shifting unit 301 includes inverters TIV30 and TIV33, inverters TIV31 and TIV32, NAND gates ND31 and ND32, and an inverter IV30. The inverters TIV30 and TIV33 operate as transmission elements that invert, buffer and transmit when the first internal strobe signal DQS_R is at a logic high level. The inverters TIV31 and TIV32 operate as transmission elements that invert, buffer and transmit when the first internal strobe signal DQS_R is at a logic low level. The NAND gates ND31 and ND32 operate as transmission elements that invert, buffer and transmit the first duration signal SECT1. The inverter IV30 is configured to invert and buffer the first internal strobe signal DQS_R and generate a first inverted internal strobe signal DQS_RB.

The enable shifting unit 301 is configured to generate an appropriate output for a second duration signal SECT2 in response to the pulse of the first internal strobe signal DQS_R and the first duration signal SECT1. When the first duration signal SECT1 is disabled to a logic low level, the enable shifting unit 301 outputs a logic high level for the second duration signal SECT2. Thus, the second duration signal SECT2 outputted from the enable shifting unit 301 is enabled in synchronization with the first falling edge of the first internal strobe signal DQS_R when the first duration signal SECT1 is enabled, and is disabled in synchronization with the time point at which the first duration signal SECT1 is disabled.

Figure 6:
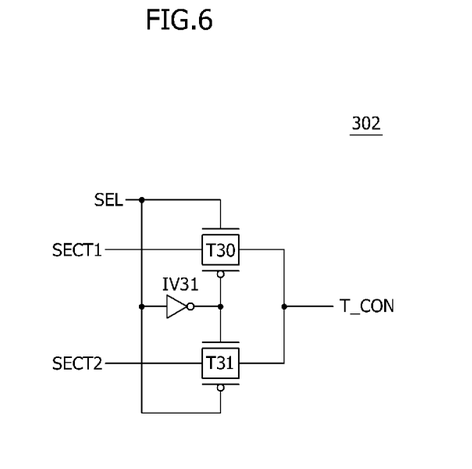
FIG. 6 is a circuit diagram of a selection output unit included in the transmission control signal generation block illustrated in FIG. 4.

Referring to FIG. 6, the selection output unit 302 includes an inverter IV31, a transmission gate T30, and a transmission gate T31. The inverter IV31 is configured to invert and buffer the selection signal SEL. The transmission gate T30 is configured to transmit the first duration signal SECT1 as the transmission control signal T_CON in response to the selection signal SEL and the output signal of the inverter IV31. The transmission gate T31 is configured to transmit the second duration signal SECT2 as the transmission control signal T_CON in response to the selection signal SEL and the output signal of the inverter IV31.

When the selection signal SEL is at a logic high level, the selection output unit 302 transmits the first duration signal SECT1 as the transmission control signal T_CON. When the selection signal SEL is at a logic low level, the selection output unit 302 transmits the second duration signal SECT2 as the transmission control signal T_CON.

Figure 7:
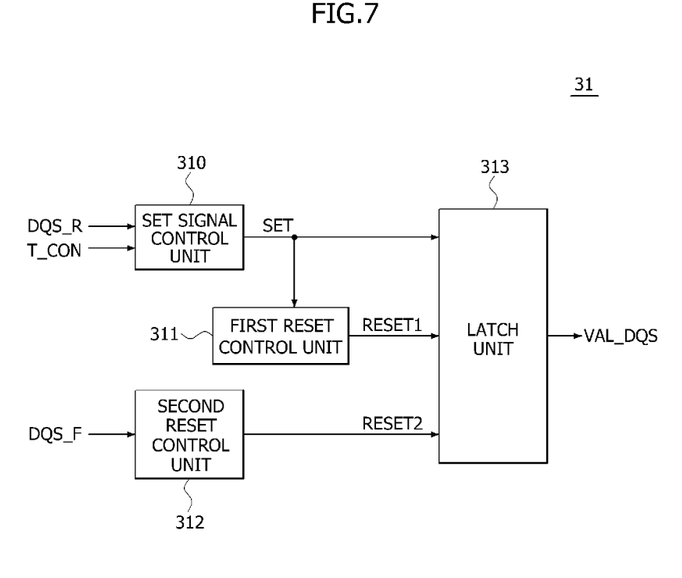
FIG. 7 is a block diagram illustrating the configuration of a valid strobe signal extraction block included in the valid strobe signal generation circuit illustrated in FIG. 3.

Referring to FIG. 7, the valid strobe signal extraction block 31 includes a set signal control unit 310, a first reset control unit 311, a second reset control unit 312, and a latch unit 313.

Figure 8:
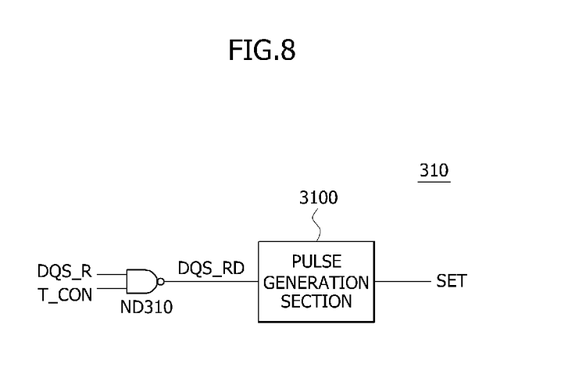
FIG. 8 is a diagram of a set signal control unit included in the valid strobe signal extraction block illustrated in FIG. 7.

Referring to FIG. 8, the set signal control unit 310 includes a NAND gate ND310 and a pulse generation section 3100. When the transmission control signal T_CON is at a logic high level, the NAND gate ND310 inverts and buffers the first internal strobe signal DQS_R and outputs a delayed internal strobe signal DQS_RD. When the delayed internal strobe signal DQS_RD is changed to a logic low level, the pulse generation section 3100 generates a pulse of a set signal SET. The set signal control unit 310 having such a configuration generates the pulse of the set signal SET in synchronization with the rising edge of the first internal strobe signal DQS_R in the state where the transmission control signal T_CON is at the logic high level.

Figure 9:
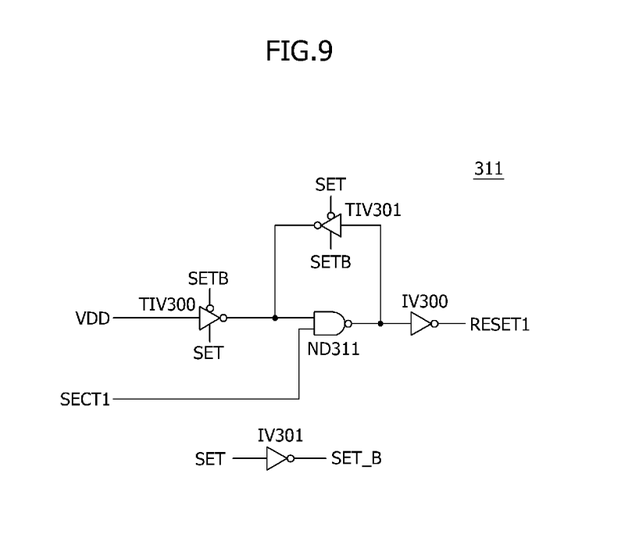
FIG. 9 is a circuit diagram of a first reset control unit included in the valid strobe signal extraction block illustrated in FIG. 7.

Referring to FIG. 9, the first reset control unit 311 includes an inverter TIV300, a NAND gate ND311, an inverter TIV301, an inverter IV300, and an inverter IV301. When the pulse of the set signal SET is inputted, the inverter TIV300 operate as a transmission element that outputs a logic low level. When the first duration signal SECT1 is at the logic high level, the NAND gate ND311 operate as a transmission element that inverts the output signal of the inverter TIV300. When the set signal SET is not asserted, the inverter TIV301 operate as a transmission element that inverts the output signal of the NAND gate ND311.

The inverter IV300 is configured to invert and buffer the output signal of the NAND gate ND311 and output a first reset signal RESET1. The inverter IV301 is configured to invert and buffer the set signal SET and generate an inverted set signal SET_B. When the pulse of the set signal SET is inputted in the state where the first duration signal SECT1 is at the logic high level, the first reset control unit 311 outputs the first reset signal RESET1 at a logic low level.

The second reset control unit 312 is configured with a pulse generation circuit and generates a pulse of a second reset signal RESET2 with a preset pulse width when the pulse of the second internal strobe signal DQS_F is inputted.

Figure 10:
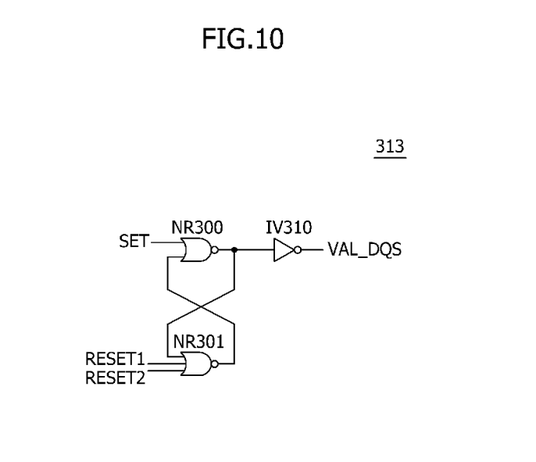
FIG. 10 is a circuit diagram of a latch unit included in the valid strobe signal extraction block illustrated in FIG. 7.

Referring to FIG. 10, the latch unit 313 is configured with a SR latch including NOR gates NR300 and NR301 and an inverter IV310. When the pulse of the set signal SET is inputted, the latch unit 313 enables the valid strobe signal VAL_DQS to a logic high level. When the pulse of the second set signal RESET2 is inputted after the first set signal RESET1 is changed to a logic low level by the pulse of the set signal SET, the latch unit 313 disables the valid strobe signal VAL_DQS to a logic low level.

Figure 11:
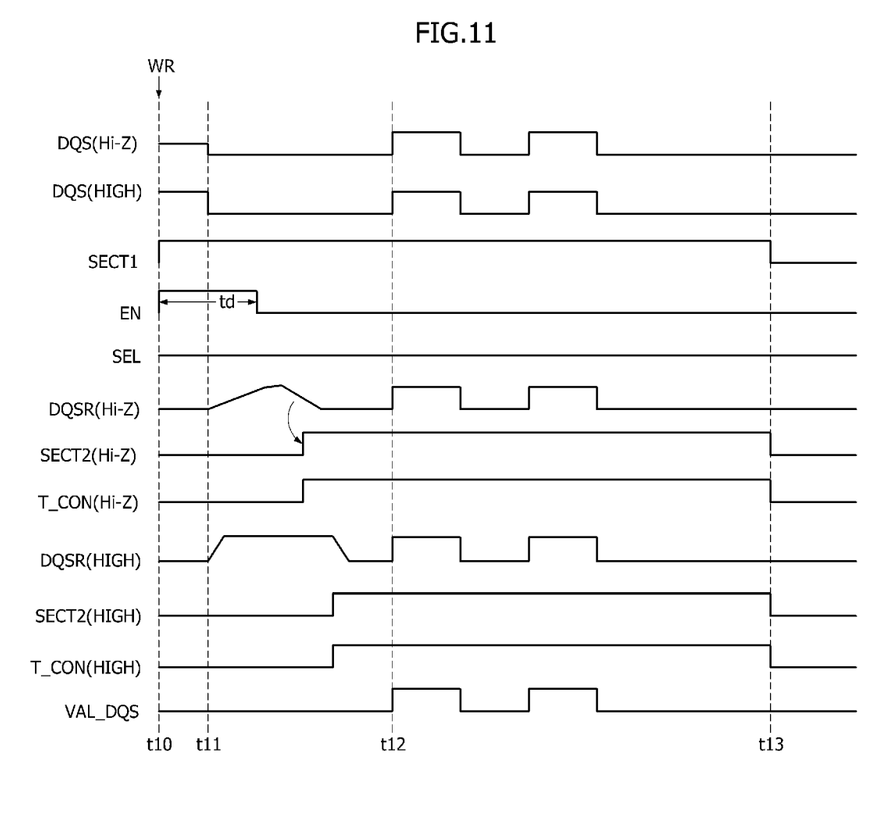
FIG. 11 is a timing chart explaining the operation of the valid strobe signal generation circuit illustrated in FIG. 3.

The operation of the valid strobe signal generation circuit 3 having the configuration illustrated in FIGS. 4 to 10 will be described with reference to the timing chart illustrated in FIG. 11 on the assumption that the data strobe signal DQS is set to the high-Z level Hi-Z or the logic high level HIGH before a preamble duration t11 to t12.

If the write command WR is inputted at the time t10, the duration signal generation section 303 included in the transmission control signal generation block 30 illustrated in FIG. 4 is configured to generate the first duration signal SECT1. The first duration signal SECT1 is enabled to the logic high level at the time t10 and disabled to the logic low level at the time t13, where t13 may be determined by the write latency information WL and the burst length information BL.

The enable signal generation section 304 in FIG. 4 is configured to generate the pulse of the enable signal EN at the logic high level for the preset duration td starting from time t10. This may be due to the first duration signal SECT1 being enabled to the logic high level at time t10. The preset duration td may be set such that the enable signal EN is disabled to the logic low level after, for example, a preamble duration t10 to t11 is completed.

The comparison section 305 in FIG. 4 is configured to compare the level of the data strobe signal DQS with the level of the reference voltage VREF for the duration for which the enable signal EN is enabled to the logic high level, and generate the selection signal SEL. Since the data strobe signal DQS is set to the high-Z level Hi-Z or the logic high level HIGH before the preamble duration t11 to t12, the selection signal SEL is generated at the logic low level.

When the selection signal SEL is at the logic low level, since the transmission gate T31 of the selection output unit 302 illustrated in FIG. 6 is turned on, the second duration signal SECT2 is transmitted as the transmission control signal T_CON.

The second duration signal SECT2 generated by the enable shifting unit 301 illustrated in FIG. 5 is enabled in synchronization with the first falling edge of the first internal strobe signal DQS_R after the first duration signal SECT1 is enabled, and is disabled in synchronization with the time point at which the first duration signal SECT1 is disabled. The enable time point of the second duration signal SECT2 is advanced in the case where the data strobe signal DQS is set to the high-Z level Hi-Z before the preamble duration t11 to t12 as compared with the case where the data strobe signal DQS is set to the logic high level HIGH. This is because the first falling edge of the first internal strobe signal DQS_R generated from the data strobe signal DQS is generated at an advanced time point when the data strobe signal DQS is set to the high-Z level Hi-Z before the preamble duration t11 to t12 as compared with the case where the data strobe signal DQS is set to the logic high level HIGH.

The set signal control unit 310 illustrated in FIG. 8 is configured to generate the pulse of the set signal SET in synchronization with the rising edge of the first internal strobe signal DQS_R in the state where the transmission control signal T_CON is at the logic high level. That is, when the transmission control signal T_CON is at the logic low level, the pulse of the set signal SET is not generated even if the pulse of the first internal strobe signal DQS_R is generated.

The first reset control unit 311 illustrated in FIG. 9 is configured to output the first reset signal RESET1 at the logic low level when the pulse of the set signal SET is inputted in the state where the first duration signal SECT1 is at the logic high level. Furthermore, the second reset control unit 312 is configured to generate the pulse of the second set signal RESET2 with the preset pulse width when the pulse of the second internal strobe signal DQS_F is inputted.

The latch unit 313 illustrated in FIG. 10 is configured to enable the valid strobe signal VAL_DQS to the logic high level when the pulse of the set signal SET is inputted, and disable the valid strobe signal VAL_DQS to the logic low level when the second set signal RESET2 is inputted after the first reset signal RESET1 is changed to the logic low level by the pulse of the set signal SET. That is, the valid strobe signal VAL_DQS generated by the latch unit 313 includes the pulse generated in synchronization with the first internal strobe signal DQS_R after the preamble duration t11 to t12 is completed.

As a result, even if the data strobe signal DQS is set to the high-Z level Hi-Z or the logic high level HIGH before the preamble duration t11 to t12 and the pulse of the first internal strobe signal DQS_R is generated in the preamble duration t11 to t12, the pulse of the valid strobe signal VAL_DQS generated by the valid strobe signal generation circuit 3 according to the embodiment of the present invention is generated after the preamble duration t11 to t12 is completed.

Thus, when the data strobe signal counter 4 counts the valid strobe signal VAL_DQS according to the burst length information BL and generates the write latch signal WR_LAT, the write latch signal WR_LAT is enabled in synchronization with the final falling edge of the data strobe signal DQS. This is because the valid strobe signal VAL_DQS generated by the valid strobe signal generation circuit 3 according to the embodiment of the present invention is not affected by the pulse of the first internal strobe signal DQS_R which is generated in the preamble duration t11 to t12.

As described above, the final falling edge of the data strobe signal DQS may be accurately counted by the valid strobe signal VAL_DQS generated by the valid strobe signal generation circuit 3 according to the embodiment of the present invention, so that data may be accurately latched in synchronization with the final falling edge of the data strobe signal DQS.

Consequently, even if the data strobe signal DQS is set to the high-Z level Hi-Z or the logic high level HIGH before the preamble duration t11 to t12, the data input circuit according to the embodiment of the present invention may accurately latch data in synchronization with the final falling edge of the data strobe signal DQS, thereby substantially preventing an abnormal operation.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A data input circuit comprising:
   a valid strobe signal generation circuit configured to remove a pulse in an internal strobe signal and generate a valid strobe signal, wherein the pulse is generated during a preamble period; and
   a data strobe signal counter configured to count the valid strobe signal according to burst length information and generate a write latch signal for aligning data at a time of a write operation.

2. The data input circuit of claim 1, wherein the valid strobe signal generation circuit comprises:
   a transmission control signal generation block configured to generate a transmission control signal in response to a level of a data strobe signal before the preamble period; and
   a valid strobe signal extraction block configured to generate the valid strobe signal in response to a first internal strobe signal, a second internal strobe signal, and the transmission control signal.

3. The data input circuit of claim 2, wherein the transmission control signal generation block comprises:
   a signal generation unit configured to generate a first duration signal and generate a selection signal by comparing the data strobe signal with a reference voltage;
   an enable shifting unit configured to generate a second duration signal by shifting an enable time point of the first duration signal in response to the first internal strobe signal;
   a selection output unit configured to selectively transmit the first duration signal or the second duration signal as the transmission control signal in response to the selection signal;
   an enable signal generation section configured to generate an enable signal in response to the first duration signal; and
   a comparison section configured to generate the selection signal by comparing a level of the data strobe signal with a level of the reference voltage in response to the enable signal.

4. The data input circuit of claim 3, wherein the first duration signal is asserted when a write command is asserted and is deasserted after a duration determined using write latency information and burst length information.

5. The data input circuit of claim 3, wherein the enable signal is enabled in synchronization with the first duration signal and disabled after the preamble duration is completed.

6. The data input circuit of claim 3, wherein the reference voltage is set to a level which is lower than an intermediate level of a logic high level and a logic low level of the data strobe signal.

7. The data input circuit of claim 3, wherein the enable shifting unit comprises:
   a first transmission element configured to output a logic low level in response to the first internal strobe signal; and a second transmission element configured to transmit an output signal of the first transmission element in response to the first duration signal.

8. The data input circuit of claim 2, wherein the valid strobe signal extraction block comprises:
a set signal control unit configured to receive the first internal strobe signal in response to the transmission control signal and generate a set signal;
a first reset control unit configured to generate a first reset signal in response to the set signal;
a second reset control unit configured to generate a second reset signal in response to the second internal strobe signal; and
a latch unit configured to generate the valid strobe signal in response to the set signal, the first reset signal and the second reset signal.

9. The data input circuit of claim 8, wherein the set signal control unit comprises:
a buffer configured to buffer the first internal strobe signal in response to the transmission control signal and generate a delayed internal strobe signal; and
a pulse generation section configured to generate a pulse of the set signal in response to the delayed internal strobe signal.

10. The data input circuit of claim 8, wherein the first reset control unit comprises:
a first transmission element configured to transmit a supply voltage in response to the set signal; and
a second transmission element configured to transmit an output signal of the first transmission element in response to a first duration signal.

11. A data input circuit comprising:
a data strobe signal buffer configured to buffer a data strobe signal and generate a first internal strobe signal and a second internal strobe signal; and
a valid strobe signal generation circuit configured to remove a pulse of the first internal strobe signal and generate a valid strobe signal, wherein the pulse is generated during a preamble period.

12. The data input circuit of claim 11, wherein the first internal strobe signal is in synchronization with a rising edge of the data strobe signal and the second internal strobe signal is in synchronization with a falling edge of the data strobe signal.

13. The data input circuit of claim 11, wherein the valid strobe signal generation circuit comprises:
a transmission control signal generation block configured to generate a transmission control signal in response to a level of a data strobe signal before the preamble period; and
a valid strobe signal extraction block configured to generate the valid strobe signal in response to the first internal strobe signal, the second internal strobe signal, and the transmission control signal.

14. The data input circuit of claim 13, wherein the transmission control signal generation block comprises:
a signal generation unit configured to generate a first duration signal, and generate a selection signal by comparing the data strobe signal with a reference voltage;
an enable shifting unit configured to generate a second duration signal by shifting an enable time point of the first duration signal in response to the first internal strobe signal;
a selection output unit configured to selectively transmit the first duration signal or the second duration signal as the transmission control signal in response to the selection signal;
an enable signal generation section configured to generate an enable signal in response to the first duration signal; and
a comparison section configured to generate the selection signal by comparing a level of the data strobe signal with a level of the reference voltage in response to the enable signal.

15. The data input circuit of claim 14, wherein the signal generation unit comprises: a duration signal generation section configured to generate the first duration signal when a write command is asserted and is deasserted after a duration determined using write latency information and burst length information.

16. The data input circuit of claim 14, wherein the enable signal is enabled in synchronization with the first duration signal and is disabled after the preamble duration is completed.

17. The data input circuit of claim 14, wherein the reference voltage is set to a level which is lower than an intermediate level of a logic high level and a logic low level of the data strobe signal.

18. The data input circuit of claim 14, wherein the enable shifting unit comprises:
a first transmission element configured to output a logic low level in response to the first internal strobe signal; and
a second transmission element configured to transmit an output signal of the first transmission element in response to the first duration signal.

19. The data input circuit of claim 13, wherein the valid strobe signal extraction block comprises:
a set signal control unit configured to receive the first internal strobe signal in response to the transmission control signal and generate a set signal;
a first reset control unit configured to generate a first reset signal in response to the set signal;
a second reset control unit configured to generate a second reset signal in response to the second internal strobe signal; and
a latch unit configured to generate the valid strobe signal in response to the set signal, the first reset signal and the second reset signal.

20. The data input circuit of claim 19, wherein the set signal control unit comprises:
a buffer configured to buffer the first internal strobe signal in response to the transmission control signal and generate a delayed internal strobe signal; and
a pulse generation section configured to generate a pulse of the set signal in response to the delayed internal strobe signal.

21. The data input circuit of claim 19, wherein the first reset control unit comprises:
a first transmission element configured to transmit a supply voltage in response to the set signal; and
a second transmission element configured to transmit an output signal of the first transmission element in response to a first duration signal.

22. The data input circuit of claim 11, further comprising a data strobe signal counter which is configured to count the valid strobe signal according to burst length information and generate a write latch signal for aligning data at a time of a write operation.

* * * * *